United States Patent [19]
Cole

[11] Patent Number: 5,221,909
[45] Date of Patent: Jun. 22, 1993

[54] ACTIVE LOAD BIASING CIRCUIT

[75] Inventor: J. Bradford Cole, Chelmsford, Mass.

[73] Assignee: Raytheon Company, Lexington, Mass.

[21] Appl. No.: 876,178

[22] Filed: Apr. 30, 1992

[51] Int. Cl.$^5$ .............................................. H03F 3/45
[52] U.S. Cl. .................................... 330/253; 330/260; 330/261
[58] Field of Search ............... 330/253, 257, 261, 260

[56] References Cited

U.S. PATENT DOCUMENTS

| | | | |
|---|---|---|---|
| 3,717,821 | 2/1973 | Amemiya et al. | 330/257 |
| 4,232,273 | 11/1980 | Leidich | 330/257 X |
| 4,335,358 | 6/1982 | Hoeft | 330/257 X |
| 4,743,862 | 5/1988 | Scheinberg | 330/257 X |
| 4,763,028 | 8/1988 | Henry | 330/253 X |
| 4,980,925 | 12/1990 | Blustine et al. | 455/327 |
| 5,142,242 | 8/1992 | Schaffer | 330/257 X |

FOREIGN PATENT DOCUMENTS

134519  8/1983  Japan .................................. 330/261

*Primary Examiner*—James B. Mullins
*Attorney, Agent, or Firm*—Richard M. Sharkansky

[57] ABSTRACT

A monopulse antenna system having a four quadrant array of antenna elements and a plurality of summing and differencing amplifiers coupled to the antenna elements for combining signals received by such antenna elements to provide such monopulse antenna with a sum antenna pattern, an azimuthal difference antenna pattern, and an elevation difference antenna pattern. The differencing amplifiers include a feedback network for increasing the common mode rejection ratio of the amplifier. The amplifiers includes a pair of transistors coupled to a voltage source through active loads and a common biasing network. The pair of transistors have electrodes connected to a common junction. A variable current source biasing network comprises a resistor voltage divider for producing an output voltage equal to a portion of a bias voltage produced at the common junction and a third transistor having a pair of electrodes coupled between the common junction and the voltage source. The output voltage produced by the voltage divider is fed to a control electrode of the third transistor to maintain the bias voltage at the common junction substantially constant with processing variations used to in the formation of the transistors.

3 Claims, 4 Drawing Sheets

_Fig. 7_

_Fig. 8_

ACTIVE LOAD BIASING CIRCUIT

BACKGROUND OF THE INVENTION

This invention relates generally to circuits having active loads and more particularly to biasing circuits used therein.

As is known in the art, monopulse antenna systems are widely used in radar systems to track targets. Such antenna systems generally include four antenna elements disposed in a four quadrant array. The signals received by the four antenna elements are fed to an arithmetic unit. The arithmetic unit combines the received signals to produce a sum antenna pattern, an azimuthal difference antenna pattern, and an elevation difference antenna pattern. The sum antenna pattern is produced by adding the signals received by the four antenna elements. The azimuthal difference antenna pattern is produced by adding the sum of the signals received by the antenna elements in the second and third quadrants and subtracting such sum from the sum of the signals received by the antenna elements in the first and second quadrants. The elevation difference antenna pattern is produced by adding the sum of the signals received by the antenna elements in the first and second quadrants and subtracting such sum from the sum of the signals received by the antenna elements in the third and fourth quadrants.

As is also known in the art, the arithmetic unit includes an arrangement of passive microwave devices, such as magic tee, branch lines, hybrid junctions, or rat races. Such arrangements are described in *Introduction to Radar Handbook* by Merrill I. Skolnik pages 177 to 178, published by Mc-Graw Hill Book Company, Inc., New York, New York, 1962. In some applications, the monopulse arithmetic unit operates at an intermediate frequency below X-Band. One such application is described in U.S. Pat. No. 4,980,925, "Monopulse First Detector Array", invented by Martin R. Blustine et el, issued Dec. 25, 1990, and assigned to the same assignee as the present invention. While the passive microwave devices described above provide the requisite sum and difference antenna patterns they are relatively large, particularly at lower microwave frequencies (i.e. below X-Band). Thus such arrangements do not lend themselves to implementation as microwave monolithic integrated circuits (MMIC).

As is also known in the art, microwave monolithic integrated circuits have been used in a wide variety of applications. Such circuits integrate on a single substrate, typically gallium arsenide, passive and active microwave components. One such active device is a microwave amplifier. As is further known in the art, analog circuits have a wide variety of applications such as in analog to digital converters, digital to analog converters, frequency to voltage converters, etc. One analog circuit is a differential amplifier. As is known, one such differential amplifier is a single-ended output differential amplifier. With such arrangement a voltage is produced at the single output which is proportional to the difference in voltages fed to a pair of input terminals of the amplifier. While ideally the output voltage is zero if the voltages fed to the input terminals are equal, in any practical circuit a residual voltage is produced at the output because of imbalances in the amplifier. The amplifier produces an output voltage having two components: a component proportional to the sum of the two input signals, called the common mode signal, $S_C$, and a component proportional to the difference between the pair of input signals, called the differential mode signal, $S_D$, where $S_D$ is the product of $S_C$ and the common mode rejection ratio (CMRR). The larger the CMRR, the more ideal the differential amplifier, all other performance parameters being equal.

One method used to increase the CMRR of a differential amplifier operating at microwave frequencies is to use a second amplifier as an active balun by, in effect, cascading two differential stages. However, the size of the resulting circuit is relatively large and the DC power consumption increases with each stage.

As is also known in the art, one type of differential amplifier includes a pair of transistors, with each transistor having a pair of electrodes coupled across a power supply. Input signals are fed to the control electrodes of the transistors. Sometimes passive, i.e. resistive or inductive, loads are coupled between the transistors and the power supply for biasing the transistors to their proper operating region. Use of resistive loads, however, increase the required operating voltage as compared with the use of active loads. Inductive loads require large amounts of surface area and limit the low frequency performance of the circuit. While the use of active loads has been suggested, errors in the process of forming the transistors may result in mismatched devices. Adjustment in the DC biasing levels to compensate for such mismatches after fabrication is difficult to achieve and impractical in high volume production.

SUMMARY OF THE INVENTION

With this background of the invention in mind it is therefore an object of this invention to provide a differential amplifier adapted for operation with a relatively low level voltage supply.

It is also an object of the invention to provide a differential amplifier having active loads for operation with a relatively low level voltage supply and adapted to operate at bias voltage levels which adjust, or compensate, for process generated mismatches between a pair of transistors used in such amplifier.

These and other objects of the invention are attained by providing an electrical circuit having an active load. The active load includes a first transistor having a pair of electrodes and a control electrode, a first one of such electrodes being coupled to the control electrode at a junction. A variable current source biasing network is provided. The biasing network includes a second transistor having a pair of electrodes and a control electrode. A first one of such pair of electrodes is coupled to the junction, and a second one of the pair of electrodes of the first and second transistors is adapted for coupling to different potentials of a voltage source. A voltage divider means is coupled across the pair of electrodes of the second transistor, for producing an output voltage equal to a portion of a voltage produced at the common junction. The output voltage is fed to a control electrode of the secondtransistor.

In accordance with an additional feature of the invention a differential amplifier includes: an active load, comprising a first transistor having one of a pair of electrodes coupled to a control electrode at a junction; and, a variable current source biasing network, comprising: i) a second transistor having a pair of electrodes and a control electrode, a first one of such pair of electrodes being coupled to the junction, a second one of the pair of electrodes of the first and second transistors being adapted for coupling to different potentials of a voltage source; and, ii) a voltage divider means, coupled across the pair of electrodes of the second transistor, for producing an output voltage equal to a portion of a voltage produced at the common junction, such output voltage being fed to a control electrode of the second transistor. The output voltage produced by the voltage divider adjusts the bias current through the first transistor to maintain the bias voltage at the common junction substantially constant with processing variations used in the formation of the first and second transistors.

In accordance with an additional feature of the invention the amplifier includes a pair of transistors coupled to a voltage source through an active load and a variable current source common biasing network. The pair of transistors have electrodes connected to a common junction. The biasing network comprises a resistor voltage divider for producing an output voltage equal to a portion of a bias voltage produced at the common junction and a bias current control transistor having a pair of electrodes coupled between the common junction and the voltage source. The output voltage produced by the voltage divider is fed to a control electrode of the bias current control transistor to adjust the bias current through the bias current control transistor and thereby maintain the bias voltage at the common junction substantially constant with processing variations used in the formation of the transistors.

BRIEF DESCRIPTION OF THE DRAWINGS

The foregoing and other features of the invention will become more apparent by reference to the following description taken together in connection with the accompanying drawings in which.

DESCRIPTION OF THE PREFERRED EMBODIMENTS

Figure 1:
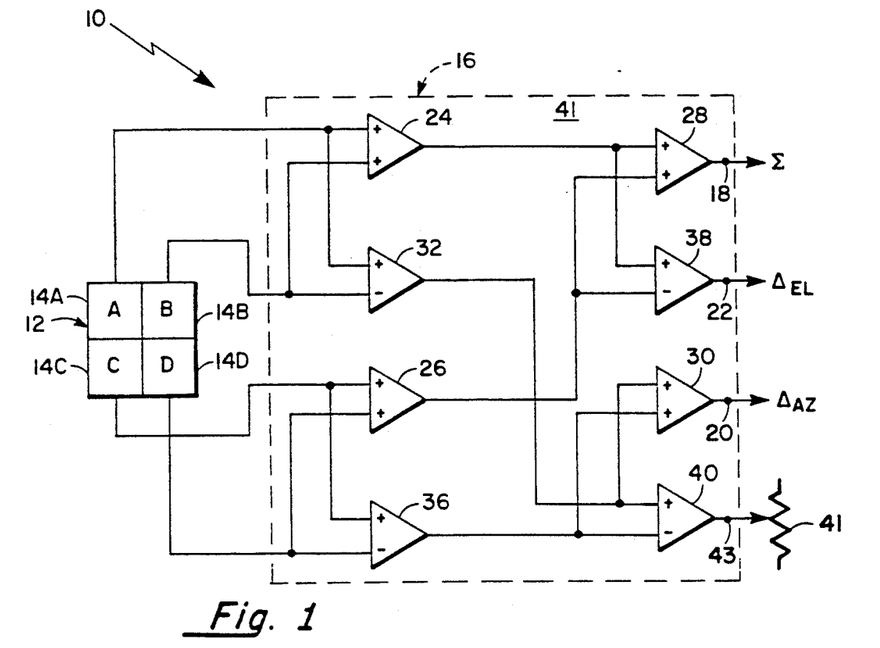
FIG. 1 is a schematic diagram of a monopulse antenna system in accordance with the invention.

Referring now to FIG. 1 a monopulse antenna system 10 is shown. Such antenna system 10 includes an array 12 of four antenna elements 14A, 14B, 14C, and 14D arranged in four quadrants, A, B, C, D, respectively, as shown. The antenna elements 14A, 14B, 14C, and 14D receive signals $R_A$, $R_B$, $R_C$, and $R_D$, respectively. The antenna elements 14A, 14B, 14C, and 14D are coupled to an arithmetic unit 16. The arithmetic unit 16 combines signals received by the antenna elements 14A, 14B, 14C, and 14D to provide the monopulse antenna 10 with a sum antenna pattern, $\Sigma$, here represented as $R_A+R_B+R_C+R_D$, at output port 18, an elevation difference antenna pattern, $\Delta_{EL}$, here represented as $(R_A+R_B)-(R_C+R_D)$, at output port 22, and an azimuthal difference antenna pattern, $\Delta_{AZ}$, here represented as $(R_A+R_C)-(R_B+R_D)$, at output port 20.

More particularly, the arithmetic unit 16 includes four summing amplifiers 24, 26, 28, 30 and four differencing amplifiers 32, 36, 38, 40 formed and interconnected on a single crystal substrate 41, here a substrate of gallium arsenide. Thus the arithmetic unit is formed as a microwave monolithic integrated circuit (MMIC). Each one of the differencing amplifiers 32, 36, 38, and 40 is identical in construction, an exemplary one thereof, here differencing amplifier 32 being shown in, and discussed in connection with, FIG. 2.

Summing amplifier 24 is coupled to antenna elements 14A and 14B to produce an output signal $G_S(R_A+R_B)$, where $G_S$ is the gain of amplifier 24. Summing amplifier 26 is coupled to antenna elements 14C and 14D to produce an output signal $G_S(R_C+R_D)$, where $G_S$ is the gain of amplifier 26.

Differencing amplifier 32 has its non-inverting (+) input coupled to antenna element 14A and its inverting (−) input coupled to antenna element 14B. In response to signals $R_A$ and $R_B$ received by antenna elements 14A and 14B, respectively, differencing amplifier 32 produces a composite signal made up of two components: a component proportional to the difference between the two input signals, called the differential mode signal, $S_D$, here $G_D(R_A-R_B)$, where $G_D$ is the differential mode gain of the differencing amplifier 32; and, a component proportional to the sum of the pair of input signals, called the common mode signal, $S_C$, here, $G_C(R_A+R_B)$, where $G_C$ is the common mode gain of the differencing amplifier 32. (As noted above $S_D$ is the product of $S_C$ and CMRR and the larger the CMRR, the more ideal the differential amplifier, all other performance parameters being equal). Likewise, differencing amplifier 36 has its non-inverting (+) input coupled to antenna element 14C and its inverting (−) input coupled to antenna element 14D. In response to signals C and D received by antenna elements 14C and 14D, respectively, differencing amplifier 36 produces a composite signal made up of two components: a component proportional to the difference between the two input signals, called the differential mode signal, $S_D$, here $G_D(R_C-R_D)$, where $G_D$ is the differential mode gain of the differencing amplifier 36; and, a component proportional to the sum of the pair of input signals, called the common mode signal, $S_C$, here, $G_C(R_C+R_D)$, where $G_C$ is the common mode gain of the differencing amplifier 36.

Summing amplifier 28 is coupled to the outputs of summing amplifiers 24 and 26 to produce an output signal at output port 18 which may be represented as: $G_S^2(R_A+R_B+R_C+R_D)$. Summing amplifier 30 is coupled to the outputs of differencing amplifiers 32 and 36 to produce an output signal at output port 20 which may be represented as: $G_SG_D[(R_A-R_B)+(R_C-R_D)]+G_SG_C(R_A+R_B+R_C+R_D)$.

Differencing amplifier 38 has its non-inverting (+) input coupled to the output of summing amplifier 24 and its inverting (−) input coupled to the output of summing amplifier 26 to produce a composite signal at output port 22 made up of two components: a component proportional to the difference between the two input signals, called the differential mode signal, $S_D$, here $G_D G_S[(R_A+R_B)-(R_C+R_D)]$ and, a component proportional to the sum of the pair of input signals, called the common mode signal, $S_C$, here, $G_C G_S (R_A+R_B+R_C+R_D)$. Likewise, differencing amplifier 40 has its non-inverting (+) input coupled to differencing amplifier 32 and its inverting (−) input coupled to differencing amplifier 36 to produce a composite signal at output port 43 made up of two components: a component proportional to the difference between the two input signals, called the differential mode signal, $S_D$, here $G_D[G_D(R_A-R_D)+G_C(R_A+R_B)-G_D(R_C-R_D)-G_C(R_C+R_D)]$, where $G_D$ is the differential mode gain of the differencing amplifier 36; and, a component proportional to the sum of the pair of input signals, called the common mode signal, $S_C$, here, $G_C[G_D(R_A-R_B)+G_C(R_A+R_B)+G_D(R_C-R_D)+R_C(R_C+R_D)]$, where $G_C$ is the common mode gain of the differencing amplifier 36. Here the output port 40 is terminated in a matched load 41.

Thus if, ideally $G_C=0$, (i.e. if the differencing amplifiers 32, 36, 38, and 40 have a theoretically infinite CMRR), the signals at the output ports 28, 38, and 30 produce the monopulse antenna sum, elevation difference, and azimuthal difference signals: $\Sigma$; $\Delta_{EL}$; and $\Delta_{AZ}$, respectively.

Figure 2:
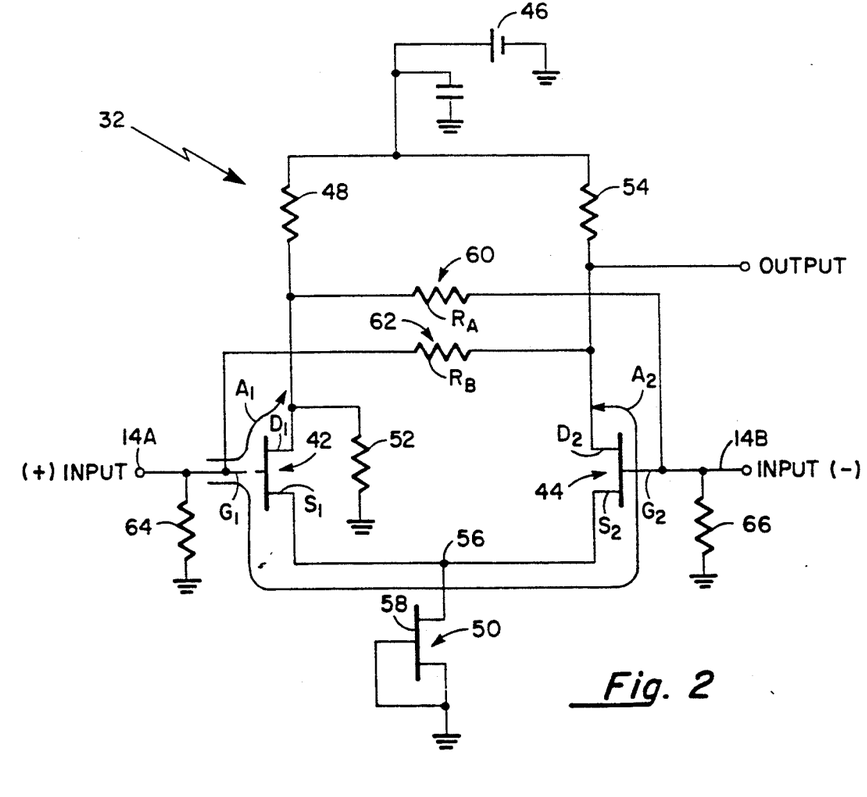
FIG. 2 is a schematic diagram of a differential amplifier usable in an monopulse arithmetic unit of the monopulse antenna system of FIG. 1.

Referring now to FIG. 2, an exemplary one of the differencing amplifiers 32, 36, 38 and 40, here amplifier 32 is shown to include a pair of field effect transistors (FETs), here depletion mode FETs 42, 44 formed in the gallium arsenide substrate 41 (FIG. 1) using conventional techniques. Transistor 42 has drain and source electrodes $D_1$, $S_1$, respectively, coupled to a voltage supply 46. More specifically, transistor 42 has drain electrode $D_1$ coupled to the positive potential of the voltage supply 46 through a passive load, here resistor 48, as shown, and source electrode $S_1$ coupled to the negative potential, here ground potential, of the voltage supply 46 through a current source 50, as shown. The drain electrode $D_1$ is also coupled to ground potential through a balancing load, here a fifty ohm resistor 52. Likewise transistor 44 has drain and source $D_2$, $S_2$, respectively, coupled to the voltage supply 46. More specifically, transistor 44 has drain electrode $D_2$ coupled to the positive potential of the voltage supply 46 through a passive load, here resistor 54, as shown, and source electrode $S_2$ coupled to the negative potential, here ground potential, of the voltage supply 46 through the current source 50, as shown. It is also noted that the source electrodes $S_1$, $S_2$ are connected to a common junction 56. Current source 50 includes a FET 58 having its drain electrode connected to the junction 56 and its gate and source electrodes connected to ground potential, as shown.

A pair of feedback networks 60, 62, here resistors $R_A$, $R_B$, respectively are provided to increase the CMRR of the differencing amplifier 32. Feedback network 60 is connected between the gate electrode $G_2$ of FET 44 and the drain electrode $D_1$ of FET 42. Likewise, feedback network 62 is connected between the gate electrode $G_1$ of FET 42 and the drain electrode $D_2$ of FET 44. The gate electrode $G_1$ of FET 42 is coupled to: antenna element 14A (FIG. 1); and, ground potential through a resistor 64, as shown. Likewise, the gate electrode G of FET 44 is coupled to: antenna element 14B (FIG. 1); and, ground potential through a resistor 66, as shown. The output of the differencing amplifier 32 is produced at the source electrode $S_2$, such output being fed to the non-inverting (+) input of differencing amplifier 40 (FIG. 1).

Figure 3:
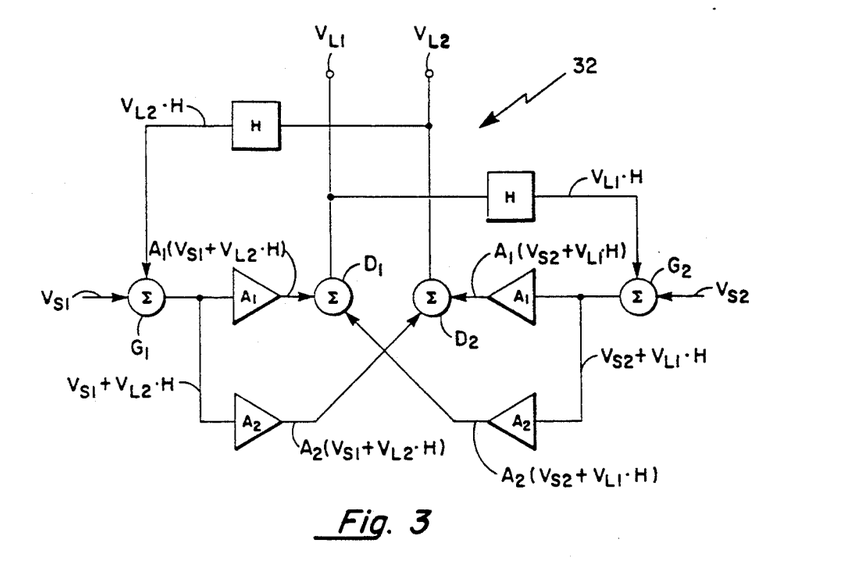
FIG. 3 is an equivalent circuit of the differential amplifier of FIG. 2, such equivalent circuit being useful in understanding the differential amplifier.

Referring now also to FIG. 3, an equivalent circuit of amplifier 32 is shown. The gain between the gate electrode $G_1$ of FET 42 and the drain electrode $D_1$ of such FET 42 is represented as: $A_1$, as shown in FIG. 2. The gain from the gate electrode $G_2$ of FET 44 to the drain electrode $D_2$ of FET 44 is also represented as: $A_1$; it being assumed, for purposes of analysis of the feedback networks 60, 62, that the FETs 42, 44 are identical to each other. The gain from the gate electrode $G_1$ of FET 42 to the drain electrode $D_2$ of FET 44 is represented as: $A_2$, as shown in FIG. 2. The gain from the gate electrode $G_2$ of FET 44 to the drain electrode $D_1$ of FET 42 is also represented as: $A_2$. The amount of feedback from drain electrode $D_1$ to the gate electrode $G_2$ through resistor $R_A$ (i.e. feedback network 60) is represented as: H. The amount of feedback from drain electrode $D_2$ to gate electrode $G_1$ through resistor $R_B$ (i.e. feedback network 62) is here also represented as: H (i.e. the resistance of resistors $R_A$ here being equal to the resistance of resistor $R_B$). The voltages produced at the drain electrodes $D_1$, $D_2$ of FETs 42, 44 are represented by $V_{L1}$, $V_{L2}$, respectively. It is noted that the electrical connections to the drain and gate electrodes of FETs 42, 44 (i.e. $D_1$, $D_2$, $G_1$, and $G_2$, respectively), are represented by summers here labelled $G_1$, $D_2$, $G_1$, and $G_2$, respectively, as shown.

From FIG. 3:

$$V_{L1} = A_1 (V_{S1} + V_{L2} H) + A_2 (V_{S2} + V_{L1} H) \qquad \text{EQ 1}$$
$$= (V_{S1} (A_1) + V_{S2} (A_2) + V_{L1} A_2 H + V_{L2} A_1 H)$$

$$V_{L2} = A_1 (V_{S2} + V_{L1} H) + A_2 (V_{S1} + V_{L2} H)$$

$$V_{L2} = \frac{V_{S1} (A_2) + V_{S2} (A_1) + V_{L1} (A_1 H)}{(1 - A_2 H)} \qquad \text{EQ 2}$$

Combining EQs 1 and 2:

$$V_{L1} = \qquad \text{EQ 3}$$
$$\frac{V_{S1}(A_1(1 - A_2 H) + A_1 A_2 H) + V_{S2}(A_2(1 - A_2 H) + A_1^2 H)}{(1 - A_2 H)^2 + (A_1 H)^2}$$

For the common mode, $V_{S1}=V_{S2}=V_S$. Thus, with such condition, from EQ 3, the common mode gain, $G_C$, may be represented as:

$$G_C = \frac{V_{L1}}{V_S} = \frac{(A_1 + A_2) + H(A_1^2 - A_2^2)}{(1 - A_2 H)^2 + (A_1 H)^2} \qquad \text{EQ 4}$$

It is first noted that without feedback, H=0. With such condition $V_{L1}/V_S$ can be made equal to zero if $A_1=-A_2$. However, because transistor 42 is connected as a common source and transistor 44 is connected as a source follower, the magnitude of the gain, $A_1$, will typically be greater than the magnitude of the gain, $A_2$. (It should be noted that there is a 180 degree phase shift between the signal at the drain electrode $D_1$ and the gate electrode $G_1$ while the signals at gate electrode $G_1$ and drain electrode $D_2$ are in-phase). Thus, in a typical design, the condition cannot be met; the use of the feedback H can produce the same effect. More specifically, by setting $V_{L1}/V_S = 0$, from EQ 4 and solving for H, it is evident that $V_{L1}/V_S$ can be made equal to zero if:

$$H = \frac{-1}{A_1 - A_2} \quad \text{EQ 5}$$

Since, as noted above the magnitude of $A_1$ is typically greater than the magnitude of $A_2$, the optimum value for H is greater than zero but less than one. Thus H can be easily realized with a resistor.

In the differential mode:

$$V_{S1} = -V_{S2} = V_S.$$

Thus, from EQ 3, the differential mode gain, $G_D$, may be represented as:

$$G_D = \frac{V_{L1}}{V_S} = \frac{(A_1 - A_2) - H(A_1^2 + A_2^2)}{(1 - A_2H)^2 + (A_1H)^2} \quad \text{EQ 6}$$

Thus, if: $H = -1/(A_1 - A_2)$, the differential mode gain which maximizes CMRR ( i.e. $G_{D(MAX)}$), may be represented as:

$$G_{D(MAX)} = \frac{V_{L1}}{V_S} = \frac{(A_1^2 - A_1A_2 + A_2^2)(A_1 - A_2)}{A_1^2} \quad \text{EQ 7}$$

Further from EQs 4 and 5, CMRR may be represented as:

$$CMRR = \frac{G_D}{G_C} = \frac{(A_1 - A_2) - H(A_1^2 + A_2^2)}{(A_1 + A_2) + H(A_1^2 - A_2^2)} \quad \text{EQ 8}$$

and if $H = -1/(A_1 - A_2)$ CMRR is theoretically infinite.

Figure 4:
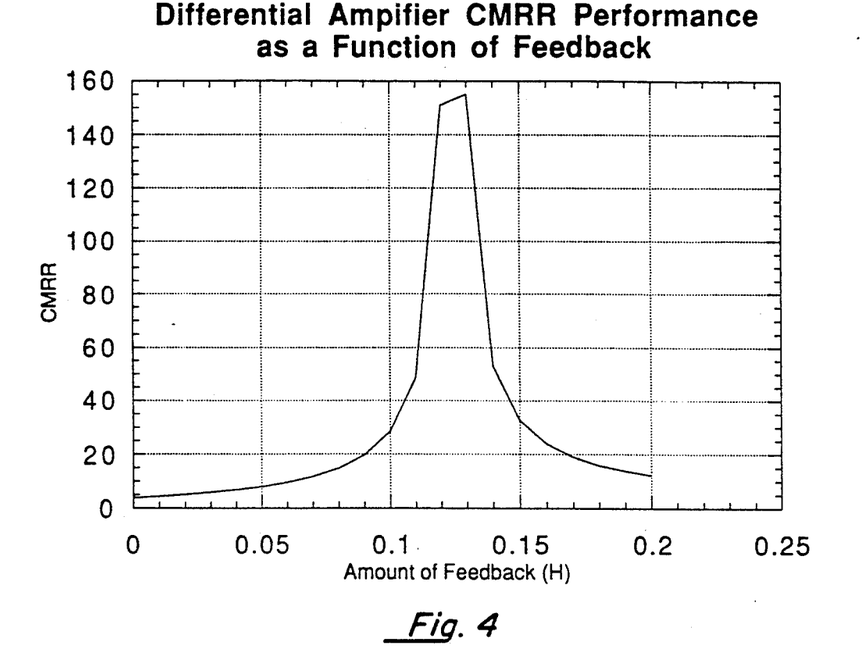
FIG. 4 is a curve showing the relationship between CMRR and the effect of a feedback network used in the differential amplifier of FIG. 2.
Figure 5:
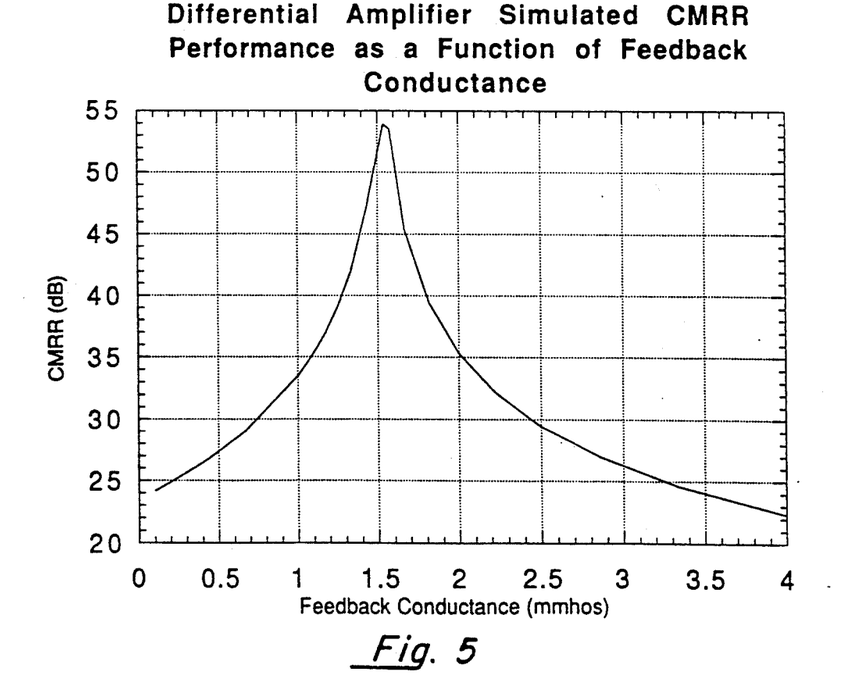
FIG. 5 is a curve showing the relationship between CMRR and the admittance of a feedback resistor used in the differential amplifier of FIG. 2.

Thus, while one way to achieve a theoretically infinite CMRR is to have $A_1 = -A_2$, any error in such condition results in a undesired, residual common mode signal. As noted above, however, if $H = -1/(A_1 - A_2)$, the CMRR can also be made theoretically infinite to thereby cancel the residual common mode signal. Simulated results for EQ 8 are shown in FIG. 4. As noted in FIG. 5 only a relatively small amount of feedback, here 1.5 milli mhos, is required to optimize the CMRR.

Considering now the DC bias voltages, if the voltage supply 46 produces a voltage of, for example, 6 volts, the voltage at junction 56 is preferably approximately 2.0 volts and the gate electrodes $G_1$, $G_2$ are at approximately ground potential. The drain electrodes $D_1$, $D_2$ are at 4 volts.

Figure 6:
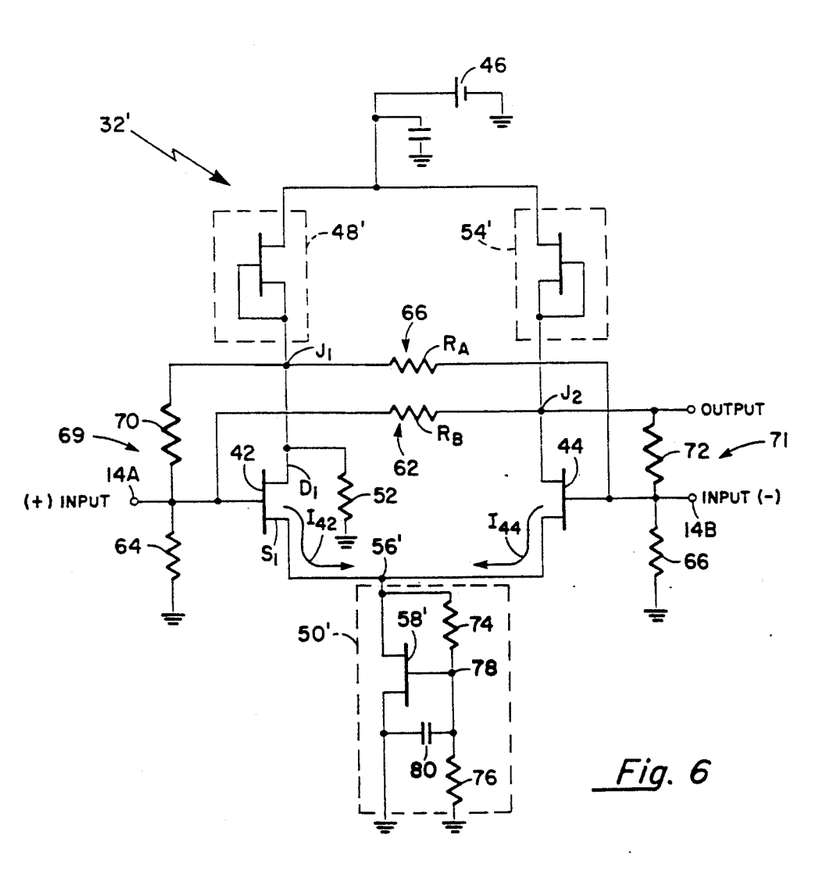
FIG. 6 is a schematic diagram of a differential amplifier according to the invention and useable in the monopulse antenna of FIG. 1.

Referring now to FIG. 6 an alternative embodiment of differencing amplifier 32, here differencing amplifier 32', is shown to include a pair of active loads, here gate-source connected FETs 48', 54', respectively, in place of resistors 48, 54 of amplifier 36 (FIG. 2). The source electrode of FET 48' and the drain electrode $D_1$ of FET 42 are connected together at a common junction $J_1$. Likewise the source electrode of FET 54' and the drain electrode $D_2$ of FET 44 are connected together at a common junction $J_2$. A voltage divider network 69 made up of a pair of resistors 70, 64 serially connected between the common junction $J_1$ and ground potential is provided. The output of the voltage divider 69 (i.e. the connection between the resistors 70, 64) is connected to the gate electrode $G_1$ of FET 42. Likewise a voltage divider network 71 made up of a pair of resistors 72, 66 serially connected between the common junction $J_2$ and ground potential is provided. The output of the voltage divider 71 (i.e. the connection between the resistors 72, 66) is connected to the gate electrode $G_2$ of FET 44. The values of the resistors 70, 64, 72, 66 establish the proper, or optimum, operating point for the active loads. Here such active load FETs 48', 54', are biased to produce a voltage drop of approximately two volts.

Figure 7:
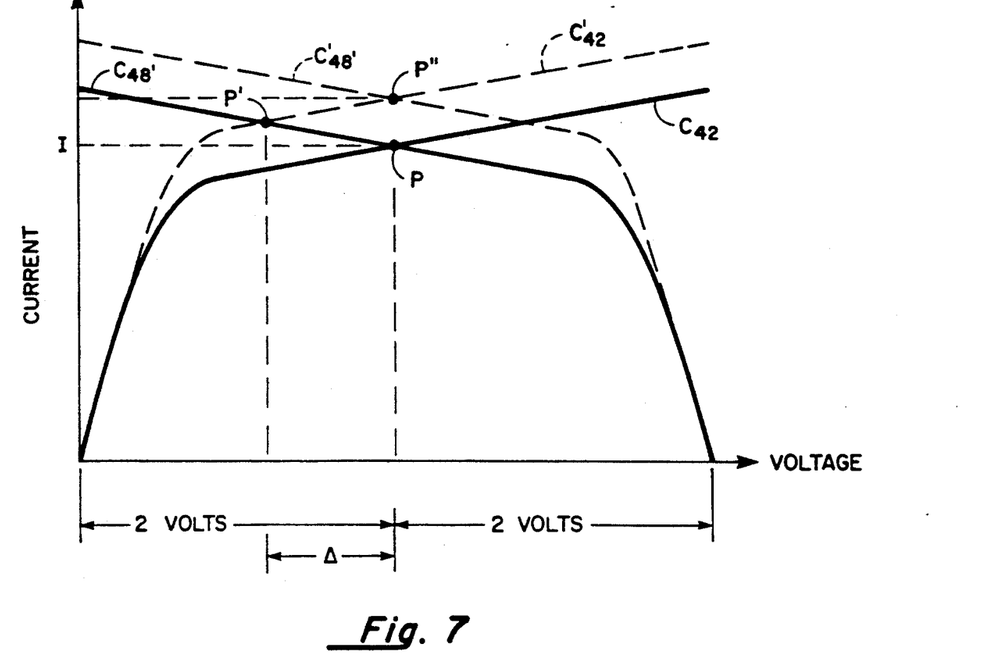
FIG. 7 is a plot of voltage-current curves at a fixed gate to source bias voltage of a pair of serially connected transistors used in the differential amplifier of FIG. 6 and useful in understanding the operation of a variable current source biasing network used therein; and, FIG. 8 is a plot of voltage-current curves useful in understanding the operation of a variable current source biasing network used in the differential amplifier of FIG. 6.

In order to understand the operation of the voltage divider networks 69, 71 let us consider one of such networks 69, 71 here network 69, understanding that both such networks 69, 71 operate in equivalent manners. Thus, let it be assumed that it is desired to operate FETs 48', 42 with the same source to drain voltage drops, here 2 volts. Thus with a voltage source 46 of six volts, the common junction $J_1$ would be at 4 volts and the source electrode $S_1$ of FET 42 would be at 2 volts. The volt-current curve for FET 48' is shown in FIG. 7 as curve $C_{48}$, and the voltage-current curve for FET 42 is shown in FIG. 7 as curve $C_{42}$ under the assumed condition. It is assumed in FIG. 7 that FETs 42, 48' have similar drain current vs. source to drain voltage characteristics even though they may be biased to different gate to source potentials. Thus both pass the same current I at the 2 volt bias; the operation of both FETs is at point P. However, if because of processing conditions FETs 48', 42 do not have similar characteristics described above, and FET 42 has a voltage-current curve indicated in FIG. 7 by the dotted curve $C'_{42}$, the operating point would be at point P' and the source-drain voltage across FET 48' will increase by $\Delta$, while the source-drain voltage of FET 42 will decrease by $\Delta$, as shown in FIG. 7. The increase in voltage across FET 48' increases the voltage at the common junction $J_1$. The increase in voltage at $J_1$ increases the DC bias voltage at the gate electrode $G_1$ of FET 42. This increase in bias voltage at gate $G_1$ increases the current through FET 42 with the result that the voltage-current curve of FET 42 changes to that shown by the dotted curve $C'_{42}$ in FIG. 7. Also redrawn in FIG. 7 is the voltage-current curve $C'_{48'}$. As noted both FETs 48', 42 return to the same 2 volt operating voltage (i.e. point P'' and both FETs have the same sourcedrain voltage of 2 volts. Likewise, if the source-drain voltage across FET 48' decreases by an amount $\Delta$, curve $C_{48'}$ shifts downward, the voltage at junction $J_1$ decreases, and the current through FET 42 decreases with the result that FET 48' returns to its 2 volt operating condition.

Figure 8:
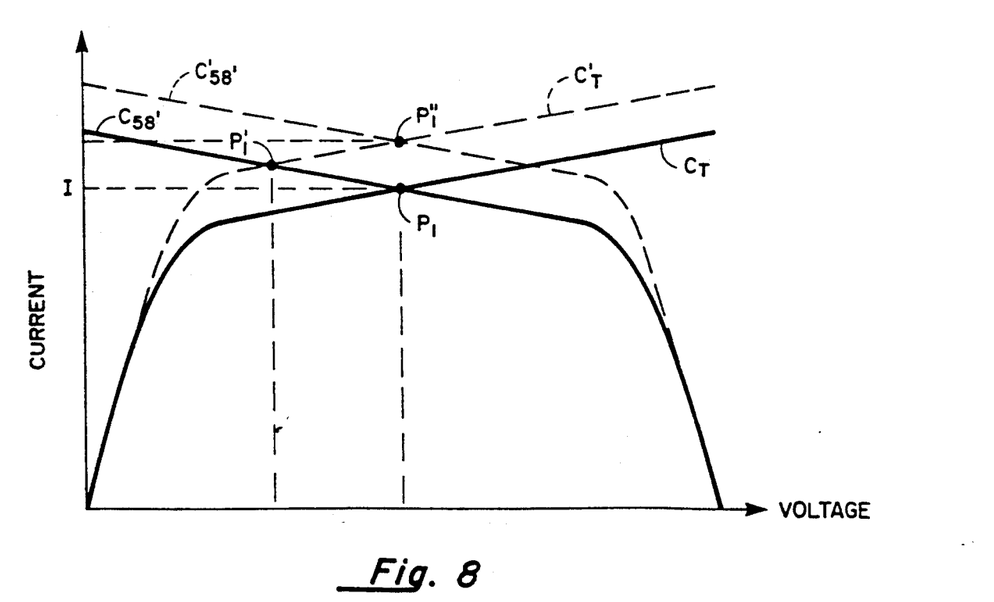

It is noted that use of active loads in place of resistive loads reduces the voltage requirement for a given amount of amplifier gain, $G_D$, compared to the amplifier 32 (FIG. 2) and hence the size, required for the voltage supply 46. This is because the voltage drop produced across the active load is only about two volts (independent of the current passing therethrough when the differential amplifier is biased for normal operation), and thus significantly smaller than that produced across a resistive load. ( It is noted the minimum resistance of a resistive load is determined by the isolation required from the voltage source. That is, the resistance must be sufficient to develop a voltage change in response to a voltage change fed to the gate electrode of the FET to which it provides a load the resistor. To put it another way, the gain, $G_D$ (for example, in the case of FET 42 and resistor 48 (FIG. 2) is proportion to the, resistance of resistor 48). Referring again to FIG. 6, it is noted that the current source 50 (FIG. 2) is replaced with a variable current source common biasing network 50'. Variable current source common biasing network 50' includes an FET 58' in place of FET 58. FET 58' has its drain electrode connected to junction 56' and its source electrode connected to ground potential, as shown. A resistor voltage divider network made up of resistors 74, 76 serially coupled between the junction 56' and ground potential is included in the variable current source common biasing network 50', as shown. The junction 78 between the resistors 74, 76 is connected to the gate electrode of FET 58', as shown. Thus, a portion of the voltage produced at junction 56' is fed to the gate electrode of FET 58' to control the current passing through the FET 58' and ground. More particularly, and referring also to FIG. 8, let it first be assumed that $I_{42}$ is the current passing through FET 42 and $I_{44}$ is the current pass through FET 44. A voltage-current curve is shown in FIG. 8 as curve $C_T$, and represents the relationship between a voltage across the drain-source electrodes of FETs 42, 44 if such FETs were connected in parallel (i.e. source electrode connected to source electrode and drain electrode connected to drain electrode), and the total current $I_T = I_{42} + I_{44}$. The FET 58' is biased as shown in FIG. 8 so that it operates at the desired operating point, $P_1$. However, the actual operating point may be point $P'_1$ because of variations in the FET device characteristics during actual fabrication. If, for example, the current $I_T$ is greater than the current $I_{58'}$, (where $I_{58'}$ is the current passing through FET 58'), $I_T$ increases, as shown by the dotted curve $C'_T$, and the operating point $P'_1$ changes to point $P''_1$. The voltage at the junction 56' increases as shown in FIG. 8. The increase in voltage at junction 56' thereby increases the voltage at junction 78. The increased voltage at junction 78 increases the current through FET 58'. The increase in current through FET 58' allows the variable current source 50' to sink the increase in current $I_T$. The increase in current through FET 58' changes the voltage-current curve of FET 58' from curve $C_{58'}$ to dotted curve $C'_{58'}$ as shown in FIG. 8 and FET 58' returns the same 2 volt operatign point (i.e. $P''_1$). Likewise, if the current $I_T$ is less than the current $I_{58'}$, the voltage at the junction 56' decreases, thereby decreasing the voltage at junction 78. The decreased voltage at junction 78 decreases the current through FET 58=. The decrease in current through FET 58, allows the variable current source 50' to sink the decrease in current $I_T$ and FET 58' returns the same 2 volt operating point. It should be noted that a capacitor 80 is provided so maintain a fixed gate to source voltage at the operating frequency without effecting the DC bias voltages.

Having described preferred embodiments of the invention, it will now become readily apparent to one of skill in the art other embodiments incorporating its concepts may be made. For example, while a pair of feedback networks 62, 66 have been shown, some degree of improvement in CMRR may be attained with only one of the feedback networks 62, 66. It is felt, therefore, that the invention should not be restricted to the described embodiments, but rather should be limited only by the spirit and scope of the appended claims.

What is claimed is:

1. A differential amplifier for producing an output voltage proportional tot he difference between a pair of input voltages fed to the amplifier, comprising:
   a) a pair of transistors, each one thereof having a pair of electrodes coupled adapted for coupling across a voltage source, a first one of such pair of electrodes of one of the pair of transistors being adapted to produce the output voltage, and each one of the pair of transistors having a control electrode adapted for coupling to a different one of the pair of input signal;
   b) active loads;
   c) a common biasing network;
   d) wherein the pair of transistors is coupled to the voltage source through the active loads and wherein the pair of transistors have one of the pair of electrodes thereof connected to the biasing network at a common junction; and
   e) means for coupling a portion of a voltage produced by one of the pair of transistors to the control electrode of such one of the pair of transistors, and wherein the biasing network comprises: a resistor voltage divider for producing an output voltage equal to a portion of a bias voltage produced at the common junction; and, a third transistor having a pair of electrodes coupled between the common junction and the voltage source, the output voltage produced by the voltage divider being fed to a control electrode of the third transistor.

2. An electrical circuit, comprising:
   a) a first transistor having a first electrode, a second electrode and a control electrode;
   b) an active load comprising: a second transistor having a pair of electrodes and a control electrode, a first one of the pair of electrodes of the second transistor being coupled to a first potential of a voltage source and a second one of the pair of electrodes of the second transistor being coupled to the control electrode of the second transistor at a first junction, the first junction being coupled to the first electrode of the first transistor;
   c) first means for coupling a portion of a voltage produced at the first junction to the control electrode of the first transistor; and
   d) second means, coupled between a second junction and a second potential of the voltage source, such second junction being coupled to the second electrode of the first transistor, the second means comprising a third transistor having a first electrode coupled to the second junction and a second electrode coupled to the second potential of the voltage source, the second means coupling a portion of a voltage produced at the second junction to a control electrode of the second transistor.

3. A differential amplifier for producing an output voltage proportional tot he difference between a pair of input voltages fed to the amplifier, comprising:
   a) a pair of transistors, each one of the pair of transistors having a first electrode, a second electrode and a control electrode, the first electrode of a first one of the pair of transistors being adapted to produce the output voltage, the control electrodes being adapted for coupling to a pair of input signal;
   b) a pair of active loads, each one thereof comprising: a transistor having a first electrode, a second electrode and a control electrode, the first electrode being coupled to a first potential of a voltage source and a second electrode being coupled to the control electrode of the transistor at a first junction, the first junction of each one of the pair of active loads being coupled to the first electrode of a corresponding one of the pair of transistors;

c) first means for coupling a portion of the voltages produced at the first junctions to the control electrodes of the pair of transistors; and d) second means, coupled between a second junction and a second potential of the voltage source, such second junction being coupled to the second electrodes of the pair of transistors, the second means comprising a third transistor having a first electrode coupled to the second junction and a second electrode coupled to the second potential of the voltage source, the second means coupling a portion of a voltage produced at the second junction to a control electrode of the third transistor.

* * * * *